(12) United States Patent
Adkisson et al.

(10) Patent No.: US 7,163,864 B1
(45) Date of Patent: Jan. 16, 2007

(54) METHOD OF FABRICATING SEMICONDUCTOR SIDE WALL FIN

(75) Inventors: James W. Adkisson, Jericho, VT (US); Paul D. Agnello, Wappingers Falls, NY (US); Arne W. Ballantine, Round Lake, NY (US); Rama Divakaruni, Somers, NY (US); Erin C. Jones, Tuckahoe, NY (US); Edward J. Nowak, Essex Junction, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/691,353

(22) Filed: Oct. 18, 2000

(51) Int. Cl.
*H01L 21/336* (2006.01)
(52) U.S. Cl. .............. 438/269; 438/300; 438/481; 438/607; 257/347
(58) Field of Classification Search .......... 438/142, 438/303, 151, 156, 212, 197, 481, 607, 269, 438/300, 206, 209
See application file for complete search history.

(56) References Cited

U.S. PATENT DOCUMENTS

| | | | | |
|---|---|---|---|---|
| 4,996,574 A | * | 2/1991 | Shirasaki | 257/66 |
| 5,273,921 A | * | 12/1993 | Neudeck et al. | 438/157 |
| 5,273,929 A | * | 12/1993 | Hirtz et al. | 438/67 |
| 5,294,564 A | * | 3/1994 | Karapiperis et al. | 438/22 |
| 5,336,633 A | * | 8/1994 | Tsuruta | 438/481 |
| 5,365,097 A | * | 11/1994 | Kenney | 257/302 |
| 5,545,586 A | | 8/1996 | Koh | |
| 6,040,605 A | * | 3/2000 | Sano et al. | 257/369 |
| 6,171,937 B1 | * | 1/2001 | Lustig | 438/585 |
| 6,441,433 B1 | * | 8/2002 | En et al. | 257/344 |
| 6,479,847 B1 | * | 11/2002 | Misewich et al. | 257/295 |
| 6,483,156 B1 | * | 11/2002 | Adkisson et al. | 257/401 |
| 6,563,131 B1 | * | 5/2003 | Adkisson et al. | 257/20 |
| 6,660,596 B1 | * | 12/2003 | Adkisson et al. | 438/286 |
| 6,833,569 B1 | * | 12/2004 | Dokumaci et al. | 257/250 |
| 2002/0153587 A1 | * | 10/2002 | Adkisson et al. | 257/510 |
| 2003/0006410 A1 | * | 1/2003 | Doyle | 257/20 |
| 2005/0205932 A1 | * | 9/2005 | Cohen | 257/347 |

FOREIGN PATENT DOCUMENTS

JP 11-251579 9/1999

\* cited by examiner

*Primary Examiner*—Matthew S. Smith
*Assistant Examiner*—Khiem Nguyen
(74) *Attorney, Agent, or Firm*—Whitham, Curtis, Christofferson & Cook, PC; Anthony Canale

(57) ABSTRACT

A double gated silicon-on-insulator (SOI) MOSFET is fabricated by forming epitaxially grown channels, followed by a damascene gate. The double gated MOSFET features narrow channels, which increases current drive per layout width and provides low out conductance.

8 Claims, 10 Drawing Sheets

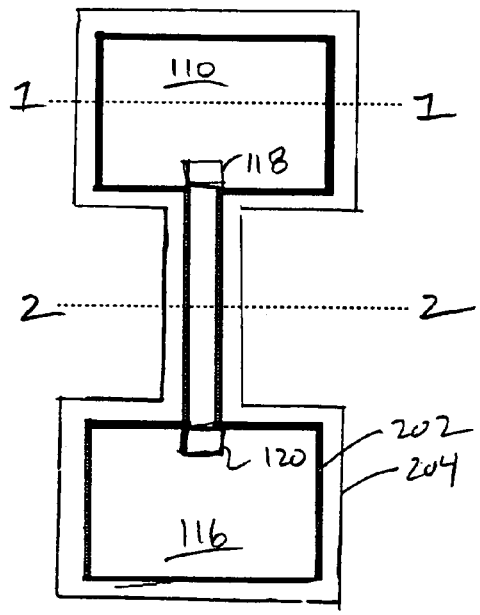
FIG 2A
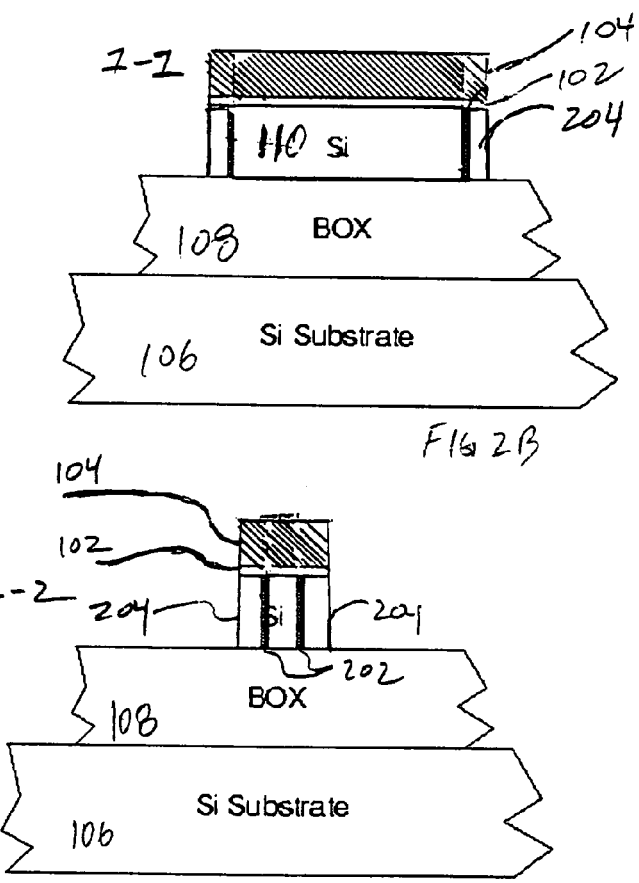
FIG 2B
FIG 2C
FIG. 2

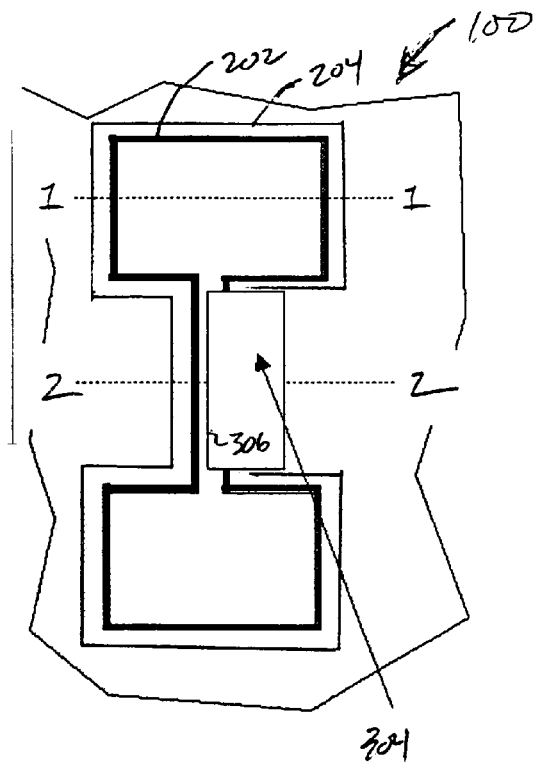
FIG 3A
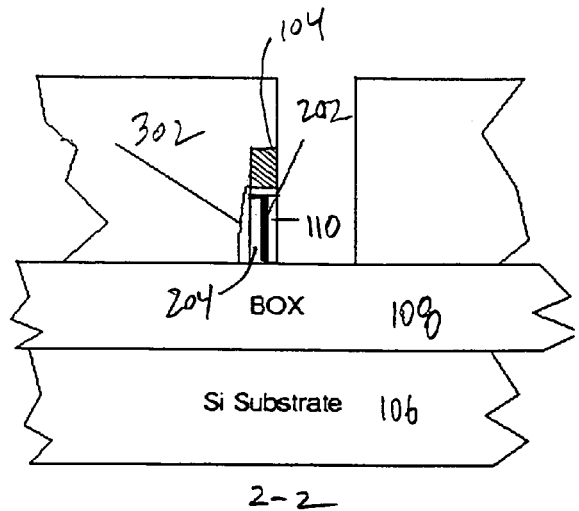
FIG 3B
FIG. 3
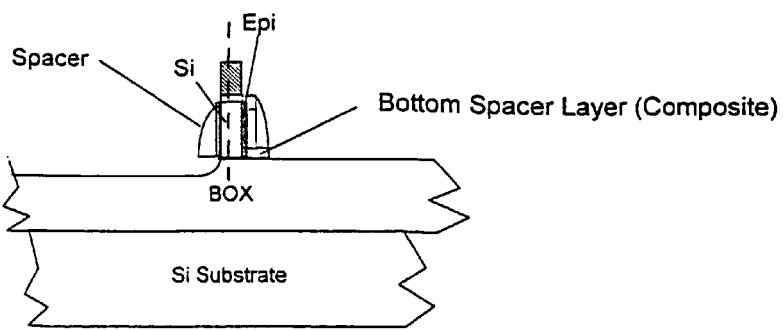
FIG. 12

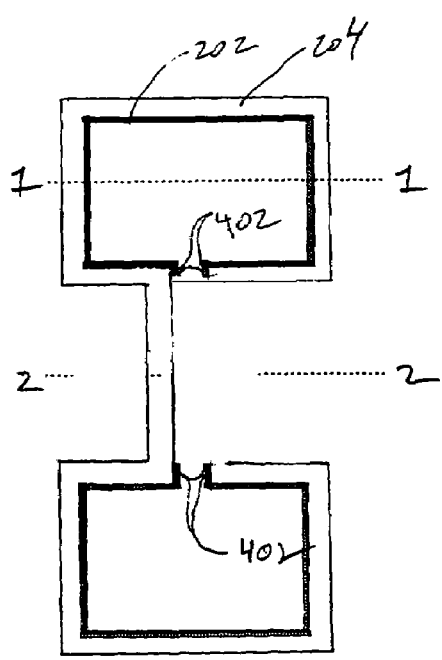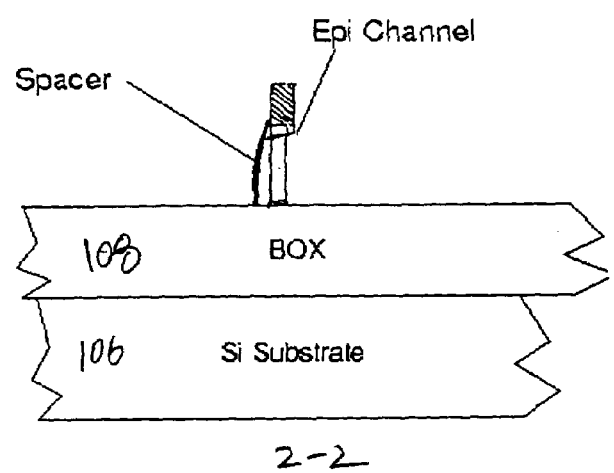
FIG 4A
FIG 4B
FIG. 4

Si Substrate

Extension Implant - Done w/ angle relative to substrate and repeated 4 times at cardinal directions relative to notch.

BOX

METHOD OF FABRICATING SEMICONDUCTOR SIDE WALL FIN

CROSS-REFERENCE TO RELATED APPLICATION

The subject matter of this application is related to the disclosure of co-pending patent application Ser. No. 09/526,857, filed Mar. 16, 2000, by James W. Adkisson, John A. Bracchitta, John J. Ellis-Monaghan, Jerome B. Lasky, Kirk D. Peterson and Jed H Rankin for "Double Planar Gated SOI MOSFET Structure" and assigned to a common assignee herewith. The disclosure of application Ser. No. 09/526,857 is fully incorporated herein by reference.

DESCRIPTION

Background of the Invention

1. Field of the Invention

The present invention generally relates to providing a dual gate metal oxide semiconductor field effect transistor (MOSFET) transistor and, more particularly, to providing a dual gate MOSFET having relatively thin epitaxially grown channels.

2. Background Description

Field Effect Transistor (FET) structures may include a single gate (a single channel) or a pair of gates, with double-gate versions providing the advantage of enabling shorter channels and thus a faster device to be produced. As gate lengths scale below 50 nm, FET scaling becomes limited by the finite depth of the gate control. Research has shown that placing gates on multiple sides of an FET channel results in improved FET performance in regard to short channel characteristics and off-current characteristics. Placing gates on multiple sides of an FET channel, provided the silicon is thin enough to be fully depleted, confines electric fields and charges much more tightly than in the standard FET in which the fields are free to penetrate deeply into an effectively infinite silicon substrate. The confinement possible with a fully depleted dual gate structure allows improved short channel effects and devices having gate lengths of 20–30 nm are possible. The inversion induced channels will be formed on both sides of the silicon and possibly across the entire channel which may increase saturation current. Other reported benefits include nearly ideal subthreshold slope, increased saturation current and reduced short-channel and floating body effects. Requirements generally are for a thin diffusion region in the range of 5–50 nm, and gate lengths down to 20–100 nm, with the gate length preferably being two to four times the diffusion length.

A number of horizontal double-gate FET structures, and particularly SOI double-gate FET structures, have been proposed. These structures typically require a bottom gate formed beneath the thin silicon body in addition to a conventional top gate. The fabrication of such structures is difficult because the top and bottom gates must be aligned to a tolerance beyond the accuracy of state of the art lithographical equipment and methods, and because self-aligning techniques are frustrated by the layers between the top and bottom gates.

In "*Self-Aligned (Top and Bottom) Double-Gate MOSFET With a 25 nm Thick Silicon Channel*", by Hon Sum Philip et al., IEDM 97–427, IEEE 1997, a double-gated MOSFET is considered the most promising candidate for a Complementary Metal Oxide Semiconductor (CMOS) scaled to the ultimate limit of 20–30 nm gate length. Rigorous Monte Carlo device simulations and analytical calculations predicted continual improvement in device performance down to 20–30 nm gate length, provided the silicon channel thickness can be reduced to 10–25 nm and the gate oxide thickness is reduced to 2–3 nm. However, the alignment of the top and the bottom is crucial to high performance because a mis-alignment will cause extra gate to source/drain overlap capacitance as well as loss of current drive.

The following patents pertain to FETs, and particularly to the double-gated FETs.

U.S. Pat. No. 5,780,327, by Chu et al. and entitled "Vertical Double-Gate Field Effect Transistor" describes a vertical double-gate field effect transistor, which includes an epitaxial channel layer and a drain layer arranged in a stack on a bulk or SOI substrate. The gate oxide is thermally grown on the sides of the stack using differential oxidation rates to minimize input capacitance problems. The gate wraps around one end of the stack, while contacts are formed on a second end. An etch-stop layer embedded in the second end of the stack enables contact to be made directly to the channel layer.

U.S. Pat. No. 5,773,331 by Solomon et al. and entitled "Method for Making Single and Double Gate Field Effect Transistors With Sidewall Source-Drain Contacts" describes a method for making single-gate and double-gate field effect transistors having a sidewall drain contact. The channel of the FETs is raised with respect to the support structure underneath and the source and drain regions form an integral part of the channel.

U.S. Pat. No. 5,757,038 by Tiwari et al. and entitled "Self-Aligned Dual Gate MOSFET with an Ultranarrow Channel" is directed to a self-aligned dual gate FET with an ultra thin channel of substantially uniform width formed by a self-aligned process. Selective etching or controlled oxidation is utilized between different materials to form a vertical channel extending between source and drain regions, having a thickness in the range from 2.5 nm to 100 nm.

U.S. Pat. No. 5,580,802 to Mayer et. al. and entitled "Silicon-on-Insulator Gate-All-Around MOSFET Fabrication Methods" describes an SOI gate-all-around (GAA) MOSFET which includes a source, channel and drain surrounded by a top gate, the latter of which also has application for other buried structures and is formed on a bottom gate dielectric which is formed on source, channel and drain semiconductor layers of an SOI wafer.

U.S. Pat. No. 5,308,999 to Gotou and entitled "MOS FET Having a Thin Film SOI Structure" describes a MOS FET having a thin film SOI structure in which the breakdown voltage of an MIS (Metal Insulator Semiconductor) FET having an SOI structure is improved by forming the gate electrode on the top surface and two side surfaces of a channel region of the SOI layer and by partially extending the gate electrode toward the inside under the bottom of the channel region such that the gate electrode is not completely connected.

U.S. Pat. No. 5,689,127 to Chu et al. and entitled "Vertical Double-Gate Field Effect Transistor" describes a vertical double-gate FET that includes a source layer, an epitaxial channel layer and a drain layer arranged in a stack on a bulk or SOI substrate. The gate oxide is thermally grown on the sides of the stack using differential oxidation rates to minimize input capacitance problems. The gate wraps around one end of the stack, while contacts are formed on a second end. An etch-stop layer embedded in the second end of the stack enables contact to be made directly to the channel layer.

The lithographically defined gate is by far the simplest, but suffers from a number of disadvantages. First, definition of the gate may leave poly spacers on the side of the diffusions or may drive a required slope on the side of the diffusion, thereby resulting in a poorer quality and/or more poorly controlled device. Second, the slope of the poly inherently leads to difficulty in forming silicided gates, leading to slower device performance. Finally, the poly step height poses a difficult problem for lithographic definition, as we expect steps on the order of 100 nm–200 nm in a 50 nm design rule technology.

The key difficulties in fabricating double-gated FETs are achieving silicidation of thin diffusions or polysilicon with acceptable contact resistance, enabling fabrication of the wraparound gate without misalignment of the two gates, and fabrication of the narrow diffusions (ideally, 2–4 times smaller than the gate length).

Additional techniques for generating the dual-gated transistors include defining the gate lithographically with high step heights (see U.S. Pat. No. 4,996,574 to Shirasaki, entitled "MIS Transistor Structure for Increasing Conductance Between Source and Drain Regions"), forming a selective epitaxial growth which provides an "air-bridge" silicon structure (see Hon-Sum Philip Wong, International Electron Devices Meeting (IEDM) 1997, pg. 427), and forming wrap-around gates with vertical carrier transport (see H. Takato IEDM, 1988, pg. 222).

In summary, previous fabrication schemes have relied upon litographically defined silicon channels and long, confined lateral epitaxial growth. However, a lithographically defined channel cannot be formed with sufficiently close tolerances and even available tolerances cannot be maintained adequately to support near-optimal dual gate transistor performance in the above approaches. Further, techniques using lateral current flow with FET widths defined laterally suffer from difficulty in aligning the top and bottom gates even though thickness of silicon can be tightly controlled.

U.S. patent application Ser. No. 09/526,857, by James W. Adkisson, John A. Bracchitta, John J. Ellis-Monaghan, Jerome B. Lasky, Kirk D. Peterson and Jed H Rankin, filed on Mar. 16, 2000, and incorporated by reference above, entitled "Double Planar Gated SOI MOSFET Structure" describes a method to create the double gate transistor, assuming the channel width can be made small enough.

SUMMARY OF THE INVENTION

It is therefore an object of the present invention to provide a dual gate transistor having relatively thin epitaxially grown channels.

According to the invention, there is provided a method of forming a field effect transistor (FET) transistor, comprising the steps of forming silicon layers on a substrate. Next, epitaxial channels are formed on a side surface of the silicon layers, with one side wall of the channels therefore being exposed. The silicon layers are then removed, thereby exposing a second sidewall of the epitaxial channels. Source and drain regions are then formed, coupled to ends of the epitaxial channels. Finally, a gate is formed over the epitaxial channels.

The invention thus seeks to provide a very thin diffusion region using a known technique for growing epitaxial regions to form the very thin channel and has the advantages of providing much tighter tolerances on channel thickness than a lithographically defined channel which can be maintained by selective etching and that epitaxial growth is not complicated by the presence of thin confining layers.

BRIEF DESCRIPTION OF THE DRAWINGS

The foregoing and other objects, aspects and advantages will be better understood from the following detailed description of a preferred embodiment of the invention with reference to the drawings, in which:

FIG. 2A shows the substrate of FIG. 1A after epitaxial growth of etch stop and channel layers;

FIG. 2B is a cross sectional view of cut 1—1 shown in FIG. 2A;

FIG. 2C is a cross sectional view of cut 2—2 shown in FIG. 2A;

FIG. 3A shows FIG. 2A with a mask opening for silicon line removal;

FIG. 3B shows a cross sectional view of cut 2—2 shown in FIG. 3A;

FIG. 4A shows FIG. 3A after the removal of any remaining portion of the silicon line and the etch stop layer;

FIG. 4B shows a cross sectional view of the 2—2 cut shown in FIG. 4A;

FIG. 12 illustrates a technique of removing defective material due to excessive faceting.

DETAILED DESCRIPTION OF A PREFERRED EMBODIMENT OF THE INVENTION

Figure 1A:
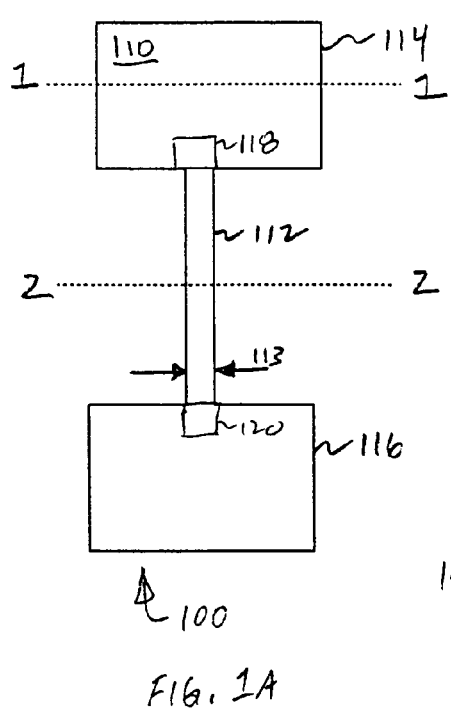
FIG. 1A is top view of the device showing a silicon line.
Figure 1B:
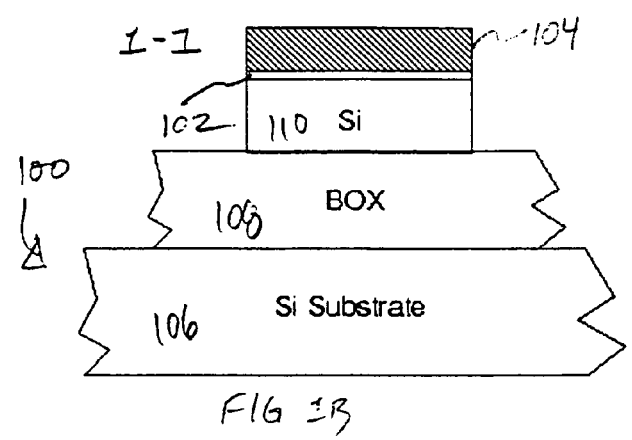
FIG. 1B is a cross sectional view of cut 1—1 shown in FIG. 1A.
Figure 1C:
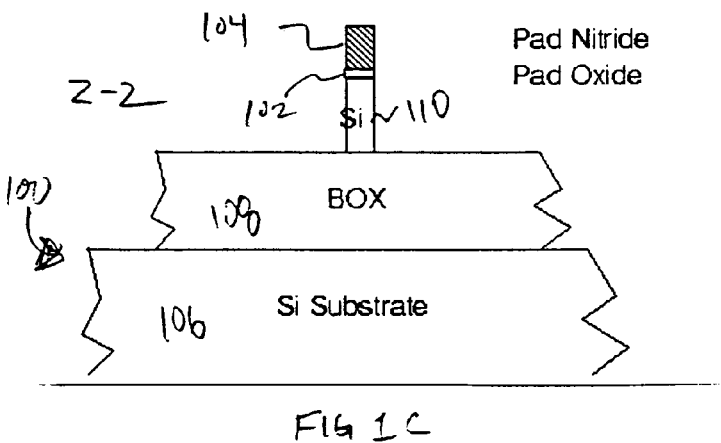
FIG. 1C is a cross sectional view of cut 2—2 shown in FIG. 1A.

Referring now to FIG. 1A, there is shown a top view of a starting silicon-on-insulator (SOI) substrate 100. As shown in FIGS. 1B and 1C, which correspond to sections 1—1 and 2—2 shown in FIG. 1A, respectively, the substrate 100 is comprised of a bulk substrate 106, a buried oxide (BOX) 108 layer, and an active layer 110. FIGS. 1B and 1C also show an oxide pad film 102 and a nitride pad film 104 on active layer 110. Those skilled in the art will realize that it may be preferable to have the oxide pad film 102 placed on top of the nitride pad film 104. The pad oxide 102 is grown using standard oxidation techniques and would typically be in the range of 3 to 14 nm, with 8 nm being preferred. Pad films 104 are placed upon pad oxide 102. It is preferred that nitride films be utilized as pad films 104, although other materials may also be used. The nitride (upper) pad films 104 are typically in the range of 30 to 120 nm, with 80 nm being preferred, and define the etch areas for shallow trench isolation (STI) formation.

The active device layer 110 is patterned to form edges 112 where the silicon channel will be formed. The width 113 of active layer 110, which is used to form what will become the channel region, is not critical, other than it must be wide enough for masking and narrow enough to confine overetching, thereby providing an adequate, practical manufacturing tolerance. It is preferred that the silicon regions that will become the source 114 and drain 116 areas and contact areas 118, 120 be formed during this stage in accordance with conventional processing techniques known to those skilled in the art.

FIGS. 2A, 2B and 2C correspond to FIGS. 1A, 1B and 1C, respectively, after epitaxial growth of etch stop 202 and subsequent epitaxial growth of the channel 204. It is preferred that the etch stop be comprised of Si(0.3)Ge (0.7), and that the epitaxially grown channel be comprised of silicon or alloys of silicon with germanium and/or carbon. Alloys of silicon with other Group IV elements (particularly germanium and carbon) can be used to optimize the FET performance by adding strain to the channel and/or modifying the conduction and valence bands across the channel to alter the device threshold or improve carrier transport. It will be evident to those skilled in the art that, prior to formation of etch stop 202 and channel 204, a suitable cleaning process is used to remove a portion of the silicon 110 under the oxide pad film 104. The width of the removed silicon should be approximately equal to the combined width of the etch stop 202 and channel 204.

Non-selective epitaxial deposition of etch stop 202 and channel 204 may be required if faceting is excessive, although selective deposition is preferred. It is preferred that the thickness of layer 202 be approximately 5 nm. Faceting will be highly dependent on details of epitaxial growth. Particularly with selective epitaxial growth, faceting may alter the thickness of the epitaxial regions as the edge of the opening is approached. Since the channel is projected to be very thin relative to the height of the growth, the area where the channel will be impacted is likely to be small. The allowed thickness before dislocations are created is sensitive to the Ge fraction and decreases quickly with increase in the Ge fraction (see A. Fischer and H. Kuhne, "Critical Dose for Strained Layer Configurations", Phys. Stat. Sol. (a), 155, 141, 1996). Then, channel 204 is epitaxially grown, preferably in the range 5–50 nm.

The bottom and top of channel 204 may be defective. Particularly if the epitaxial layer is thin, the region is likely to be extremely small and may not be significant to the formation of the device. However, if it is necessary to remove these regions, two processes are available to do so at small but tolerable, degrade of device width control. Specifically, a spacer could be deposited similar to that of spacer 302 of FIG. 3B, but etched lower to uncover the top of the epitaxial region. After this spacer is formed, the buried oxide is etched underneath the spacer as shown on the left side of FIG. 12. Alternatively, a thin composite spacer may be used. In this case, the bottom of the spacer are isotropically etched to uncover the top and bottom regions. The height of the spacer (overetch) is determined by the undercut necessary to reach the epitaxial region at the bottom of the spacer, as shown on the right side of FIG. 12. After the defective regions are etched, the spacers are removed selectively to the epitaxial regions and the buried oxide layer before proceeding to following processing steps. It should be noted that it is also possible to perform the procedure described above after the spacer shown in FIG. 4B is removed with the spacers of the above described procedure being removed before further processing.

FIGS. 3A and 3B correspond to FIGS. 2A and 2C, respectively, after additional processing steps, as described below. As shown in FIG. 3B, spacers 302 are formed, using a suitable technique and material widely known to those skilled in the art, to protect the channel 204 against attack.

Then, a mask is applied and positioned such that the mask opening 304, shown in FIG. 3A, provides for removal of the exposed portion of silicon layer 110 and etch stop 202 within the mask opening 304. It is preferred that the mask 304 be aligned as closely as possible to the channel 204. The exposed silicon 110 within mask opening 304 is then etched using an anisotropic etch.

The exposed silicon 110 within mask opening 304 is then etched. Since not all of the silicon 110 will be removed during this etch, the silicon layer 110 is also etched laterally, stopping on etch stop 202 (see K. D. Hobart, F. J. Kub, M. E. Twigg, G. G. Jernigan, P. E. Thompson, "Ultra-Cut: A Simple Technique for the Fabrication of SOI Substrates with Ultra-thin (<5 nm) Silicon Films", Proc. IEEE International Silicon on Insulator (SOI) Conference, p 145–146, October 1988.) KOH can be utilized as an etchant, which has a selectivity of approximately 20:1 for Si:Si(0.3)Ge(0.7), whereas $NH_4OH$ is reported to have a selectivity of better than 100:1 for a 25% Ge film (see G. Wang et. al., "Highly Selective Chemical Etching of Si vs. Si(1–x)G(x) using NH4OH solution, J. Electrochem. Soc., Vol. 144(3), March 1997, L37).

Thus, with an overlay of approximately 70 nm, and an edge tolerance of approximately 20 nm, the expected thickness required is approximately 85 nm. Assuming a 20% overetch, a 100 nm etch will be required. The worst case SiGe attack would then be approximately 5 nm when KOH is utilized as the etchant, and approximately 1 nm with $NH_4OH$ is utilized as the etchant.

Next, etch stop 202 is selectively etched to the channel 204. The selectivity for $HF:H_2O_2:CH_3COOH$ is approximately 1000:1 for a 70% Ge film. Assuming a 10 nm etch, Si attack is therefore negligible. The selectivity for $HNO_3$: $H_2O$:HF (40:20:5) is approximately 25:1 selectivity for a 50% Ge film. The effective HF dilution is approximately 12:1. Oxide attack will be significant, but can be controlled in accordance with conventional processing steps widely known to those skilled in the art. Etch rates for $HNO_3:H_2O$: HF are approximately 40 nm/min, suggesting very short exposures, and probably allowing further dilution for control. (see D. J. Godbey et. al., "Selective Removal of Si(1–x)Ge(x) from <100> Si using $HNO_3$ and HF, J. Electrochem. Soc., 139(10), 2943, 1992). Spacers 302 can be removed, if necessary, in accordance with conventional processing steps widely known to those skilled in the art.

Figure 5:
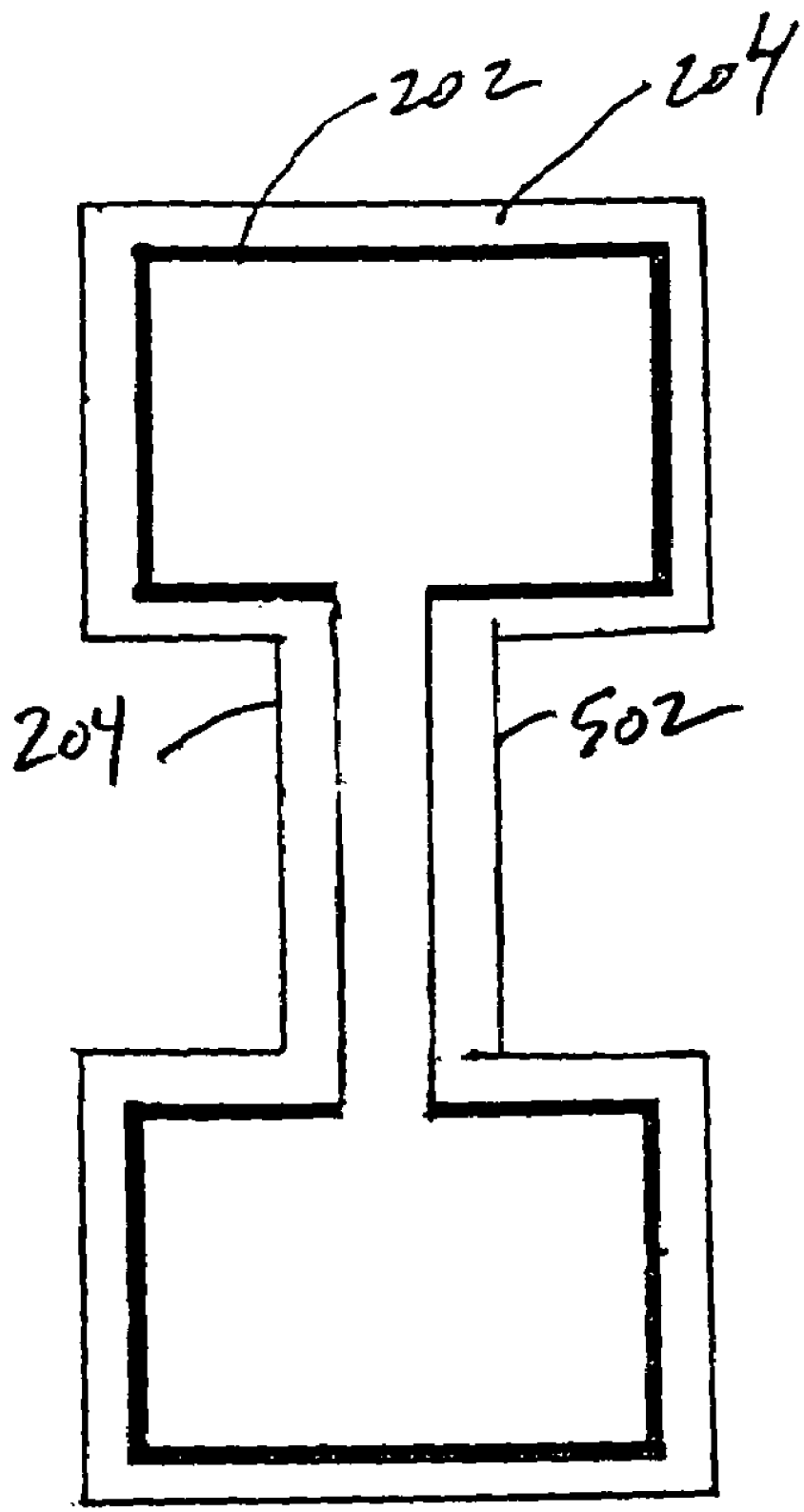
FIG. 5 shows the device of FIG. 4A after the formation of a second channel.

FIGS. 4A and 4B correspond to FIGS. 3A and 3B, respectively, after the etching of active layer 110 and etch stop 202. If necessary, a trim mask can be applied to remove undesired fins 402 in accordance with conventional processing techniques widely known to those skilled in the art. FIG. 5 shows the device of FIG. 4A after the formation of a second channel 502 which, as will be readily recognized by those skilled in the art, can be formed by using the same processing steps as previously described for the first channel 204.

Having formed the first 204 and second 502 channel regions, a first sequence of final processing steps required to complete the dual-gated transistor is described below.

Figure 6:
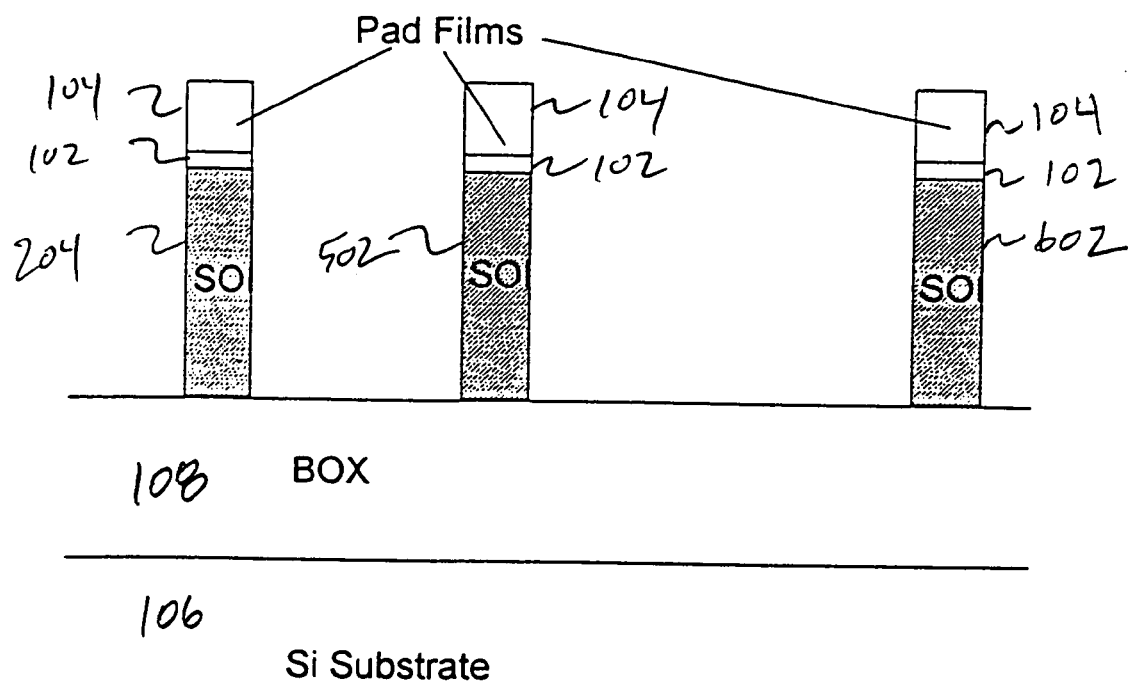
FIG. 6 is a representational cross section of cut 2—2 shown in FIG. 5.

Referring now to FIG. 6, channels 204 and 502 of FIG. 5 are shown, as well as an additional channel 602 that may be used to form another gate structure. It should thus be understood by those skilled in the art that substrate 100 may comprise many channels in addition to shown channels 204, 502 and 602. Here, the substrate 100 thus comprises bulk substrate 102, BOX layer 104, and channels 204, 502 and 602.

Figure 7:
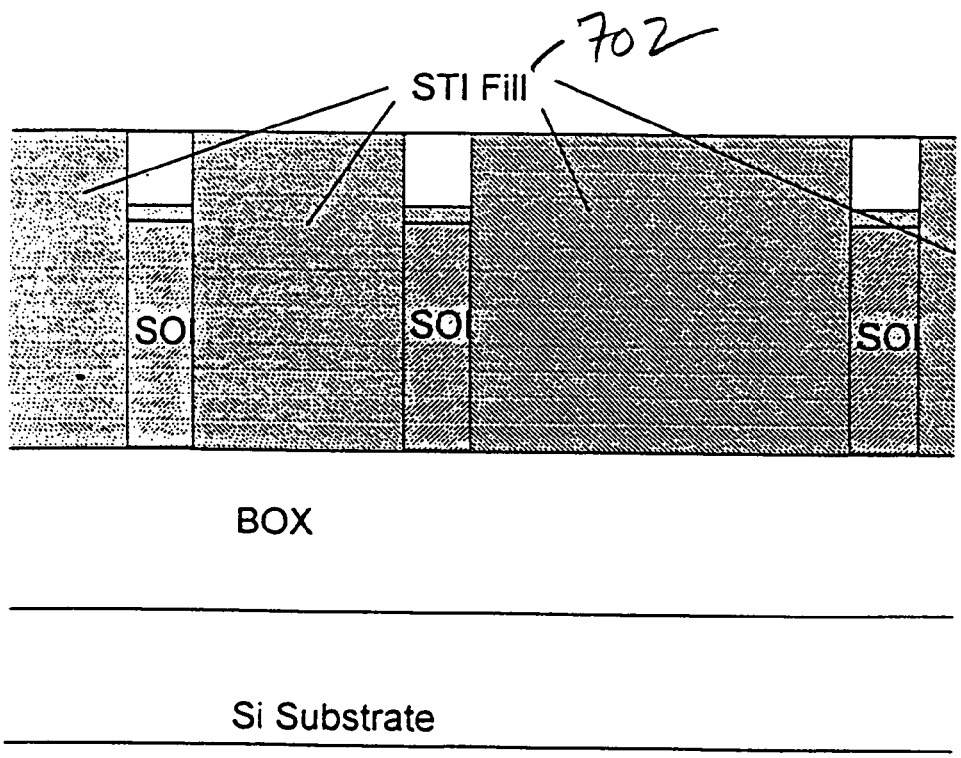
FIG. 7 shows the substrate of FIG. 6 after shallow trench isolation (STI) fill and polish.

Then, in FIG. 7, a standard STI fill 702 is provided, which is preferably a silicon dioxide layer of approximately 300 to 500 nm thick. However, other suitable materials known to those skilled in the art may also be used as a sacrificial film. It is preferred that the STI surface be planarized by polishing.

Figure 8A:
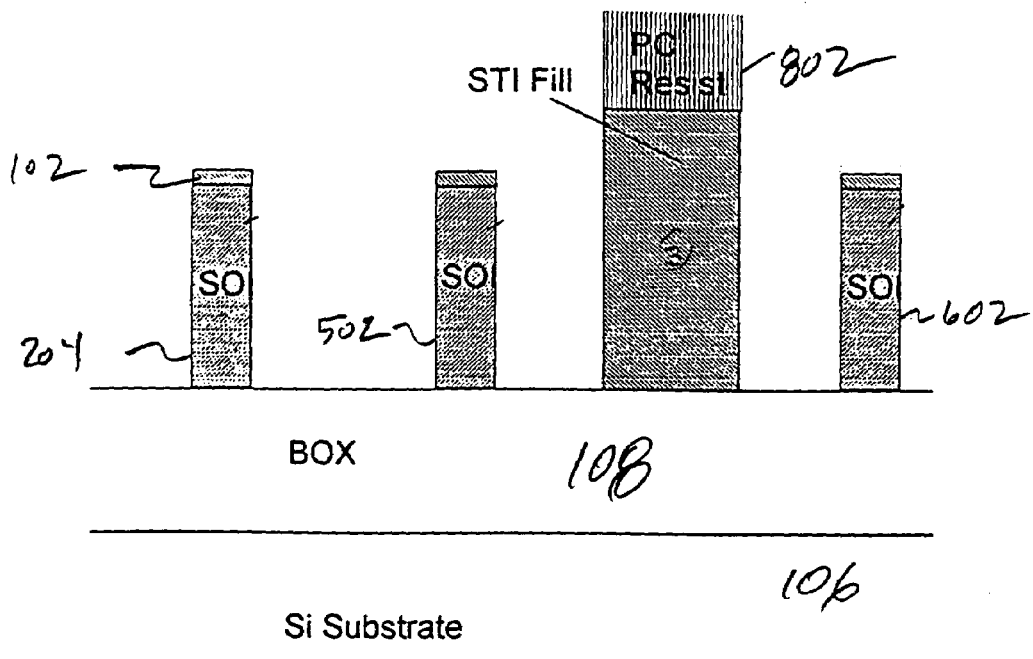
FIG. 8A is a representational cross section of cut 2—2 shown in FIG. 11B, after a polysilicon conductor (PC) resist mask is applied and etching.
Figure 9A:
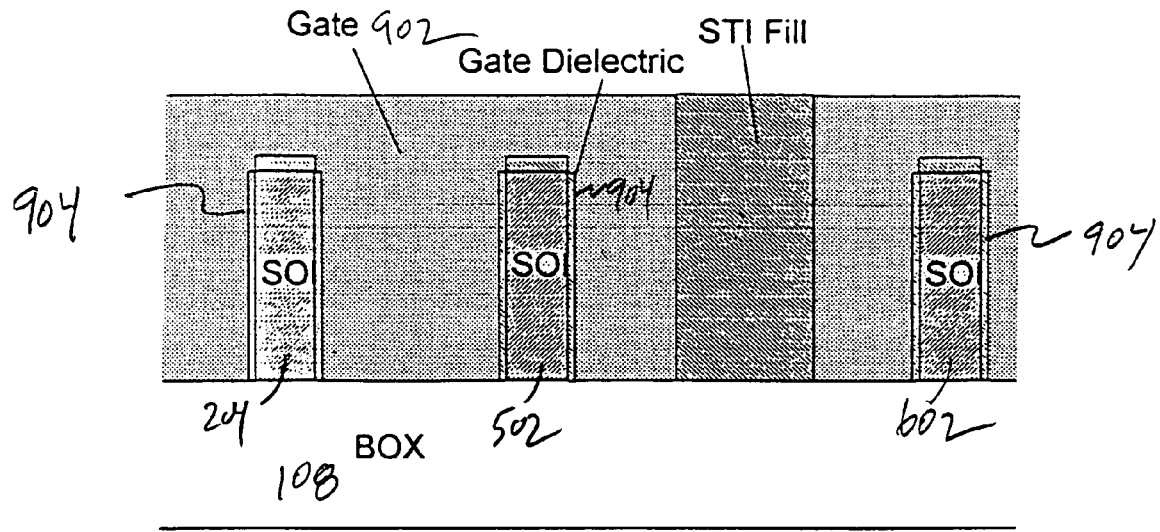
FIG. 9A shows the substrate of FIG. 8A after gate dielectric growth or deposition, and gate conductor deposition.
Figure 10A:
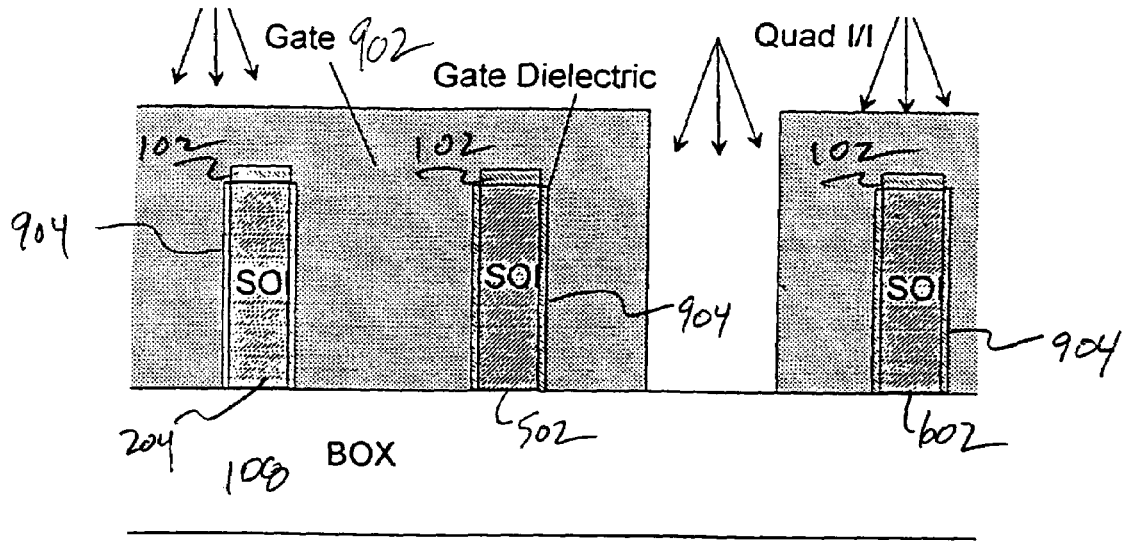
FIG. 10A shows removal of STI and isolation implants in the substrate of FIG. 9A.
Figure 11A:
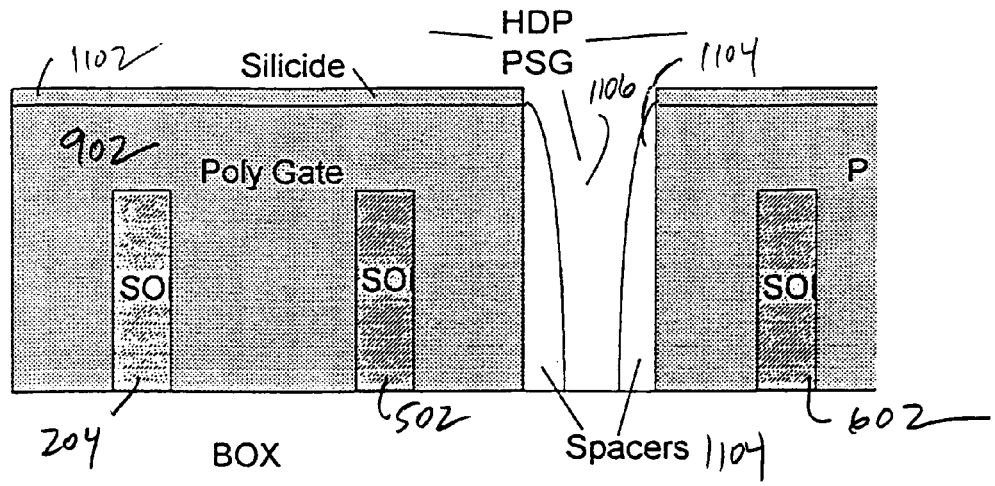
FIG. 11A shows the completed device of FIG. 10A before contacts.
Figure 11B:
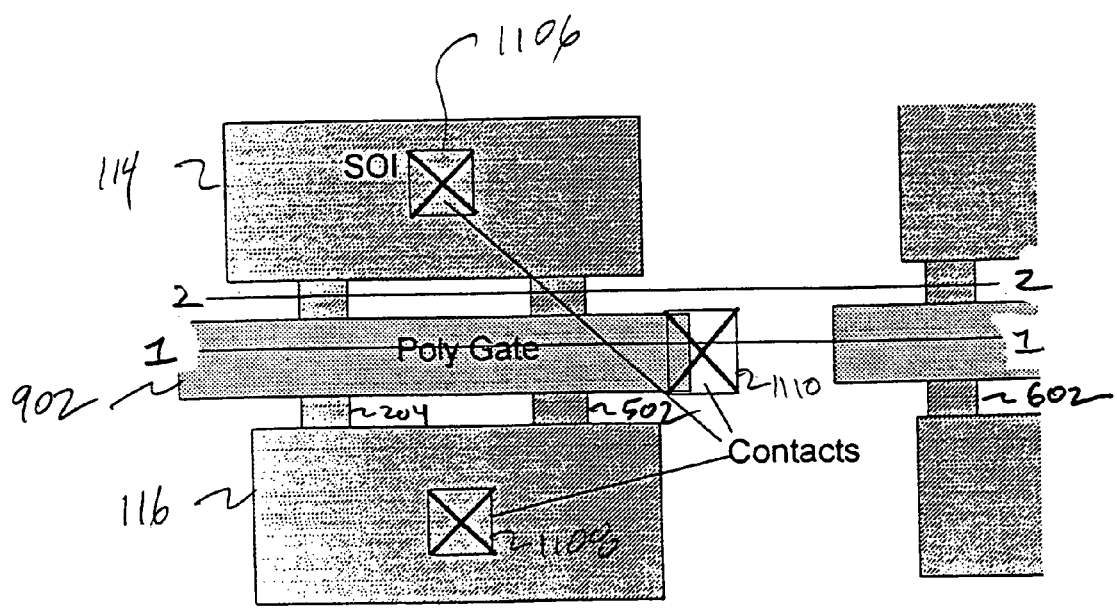
FIG. 11B shows a top view of the completed device.

FIG. 8A is a representational cross-sectional cut of section 1—1 of FIG. 11B. FIG. 8A is representational because polysilicon conductor (PC) resist 802 and STI fill 702 are present during fabrication in FIG. 8A, but are not present in corresponding region 114 of FIG. 11B. After placing the PC resist mask 802 on a selected regions of STI fill 702, STI fill 702 is selectively etched relative to pad films 104 and down to the BOX layer 108. It is preferred, but not required, that the etch also be selective relative to the BOX layer 108. Pad films 104 are then removed selectively to the STI fill layer 702 and BOX layer 104. FIGS. 9A and 10A show that the pad layers 104 could be left, if desired, to allow a thin gate dielectric 904 only on the sidewalls of channels 204, 502 and 602. It is preferred that there be approximately a 10:1 selectivity in each etch, which can be accomplished with known state of the art etches. If desired, well implants may optionally be introduced at this point. These implants would be done using highly angled implants, preferably in the range of 10 to 45 degrees, with each implant rotated at approximately 90 degrees relative to each other in order to fully dope the sidewalls of the diffusion. In order to avoid doping the surface layer of the diffusions more heavily than the sides, the implantation could be done before removing the pad films 104 in the exposed areas of PC resist 802.

Figure 8B:
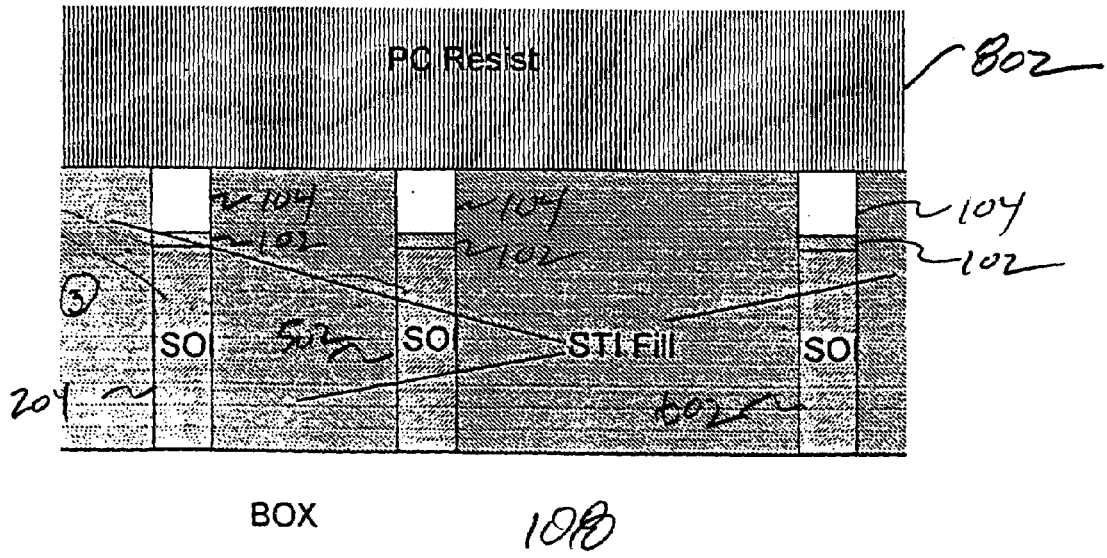
FIG. 8B is a representational cross section of cut 2—2 shown in FIG. 11B, after a PC resist mask is applied.

FIG. 8B is a representational cross-sectional cut of section 2—2 shown in FIG. 11B. FIG. 8B is representational because PC resist mask 802 and STI fill 702 are present during fabrication in FIG. 8B, but are not shown in the region between the source 114, drain 116, and gate 902 in FIG. 11B. FIG. 8B thus shows the selective placement of PC mask 802 during fabrication. This can be accomplished using standard pattern lithography techniques using a PC mask preferably composed of either photoresist or a hardmask.

FIG. 9A shows the substrate of FIG. 8A after gate dielectric growth 904 (e.g., $SiO_2$), and gate conductor 902 deposition. It should be understood that nitrided oxides, nitride/oxide composites, metal oxides (e.g., $Al_2O_3$, $ZrSiO_4$, $TiO_2$, $TaO_5$, $ZrO_2$, etc.), perovskites (e.g., $(Ba, Sr)TiO_3$, $La_2O_3$) and combinations of the above can also be used as the dielectric. Gate dielectric growth on each channel 204, 502 and 602 could be standard furnace or single-wafer chamber oxidations in accordance with conventional methods. If desired, nitriding species (e.g., $N_2O$, NO or $N_2$ implantation) can be introduced prior to, during, or subsequent to oxidation. Gate dielectric deposition on each channel 204, 502 and 602 can be accomplished, for example, through chemical vapor deposition (CVD) or other techniques known to those skilled in the art.

After etching, the gate 902 is deposited. Gate conductor deposition could be accomplished using conventional CVD or directional sputtering techniques. It should be understood that gate conductors other than polysilicon can also be used. For example, an SiGe mixture, refractory metals (e.g., W), metals (e.g., Ir, Al, Ru, Pt), and TiN can be used. In general, any material that can be polished and that has a high conductivity and reasonable workfunction can be used in place of polysilicon. After deposition, the gate 902 is polished in accordance with conventional techniques.

Figure 9B:
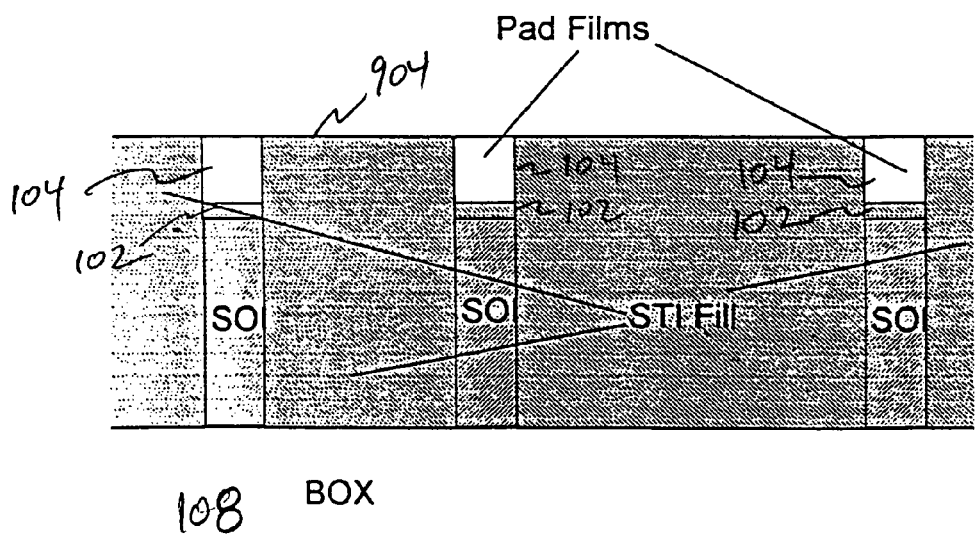
FIG. 9B shows the substrate of FIG. 8B after removal of the PC resist mask.

FIG. 9B shows FIG. 8B after removal of the PC resist mask 802. The STI surface 904 is cleaned in accordance with conventional techniques.

Figure 10B:
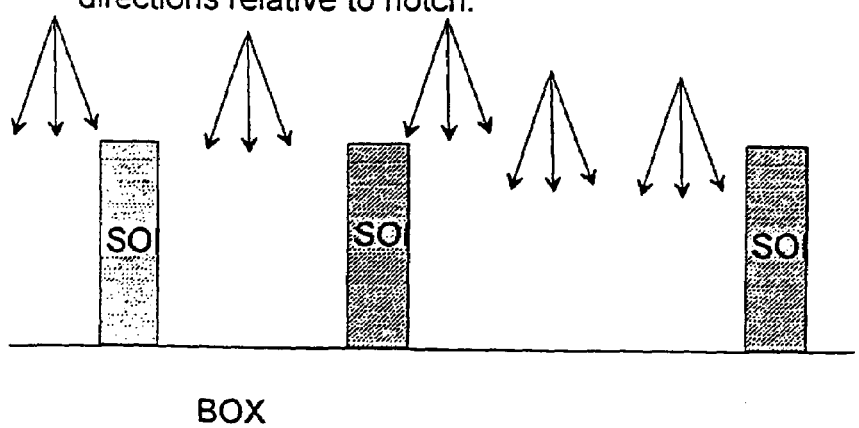
FIG. 10B shows extension implants in the substrate of FIG. 9B.

FIGS. 10A and 10B show extension implants to form the MOSFET device of FIG. 9A after removal of STI fill 702. Implantations are done at a large angle, preferably in the range of 7 to 45 degrees, relative to a vector perpendicular to the wafer surface. Four implants, each rotated at approximately 90 degrees relative to each other about the wafer surface normal vector in order to fully dope the sidewalls of the diffusions uniformly. The pad oxide layer 102 on top of the diffusions may be utilized to avoid doping the surface of the diffusions too strongly. In this case, the pad films 104 would be removed after the implantation, but before the final implantations are done, which would follow the spacer 146 deposition.

FIG. 11A shows the device of FIG. 10A after formation of silicide layer 1102 in accordance with conventional steps. Also in accordance with conventional steps, after the gate 902 is formed, spacers 1104 are formed and the diffusions are annealed, and a layer of highly conformal dielectric fill 1106 is deposited, and then polished to the top of the gate conductor. It is preferred that dielectric fill 1106 is a nitride layer followed by a doped glass. Because of the high aspect ratios, fill properties suggest a rapid-thermal CVD or a self-sputtering deposition using a high-density plasma-enhanced CVD technique. Typically, the dielectric glass includes phosphorus and/or boron, but it can also be undoped.

FIG. 11B shows a top view of the completed device. The source 114 and drain 116 region are formed by implantation. Contacts 1106, 1108, 1110 are added and back end of line (BEOL) processing is done in accordance with conventional steps.

Referring again to FIG. 8A, the second sequence comprises the steps of removing the pad oxide 102 and pad nitride 104 films. If necessary, disposable spacers can be formed and the top of the channels 204, 502 and 602, if defective, can be etched. As shown in FIG. 9A, gate oxide is then grown, and the gate 902 is deposited, preferably from among the same materials described above, and etched to form gates.

While the invention has been described in terms of its preferred embodiments, those skilled in the art will recognize that the invention can be practiced with modification within the spirit and scope of the appended claims.

The invention claimed is:

1. A method of forming a field effect transistor (FET), comprising:
   providing a substrate;
   forming a layer on the substrate, the layer having exposed vertical side surfaces on opposite sides of the layer, the layer being able to support epitaxial growth on said side surfaces;

forming an epitaxial channel on each of the exposed vertical side surfaces of the layer, the channel having an exposed first vertical sidewall opposite the vertical side surface of the layer;

removing a channel on a first vertical side surface of the layer and then removing the layer, thereby exposing a second vertical sidewall of the channel formed on the second vertical side of the layer;

forming a second channel in place of said removed channel; and forming a gate adjacent to at least one of the sidewalls of the channel and the second channel, there being a gate dielectric between each channel and the gate.

2. A method of forming an FET, comprising:

forming on a substrate a first semiconductor layer having first and second ends and a central region that is thinner than said first and second ends, said central region having first and second side surfaces extending upward from said substrate, said semiconductor layer being able to support epitaxial growth on said first and second side surfaces;

epitaxially growing a semiconductor channel region on at least one of said first and second side surfaces of said central region of said first semiconductor layer, a first side of said channel being exposed;

removing said central region of said first semiconductor layer, thereby exposing a second side of said channel;

forming a dielectric layer on exposed surfaces of said semiconductor channel region; and forming a gate electrode on said dielectric layer.

3. The method of claim 2, wherein said semiconductor channel region is formed of a combination of Group IV elements.

4. The method of claim 2, wherein said semiconductor channel region is formed of an alloy of silicon and a Group IV element.

5. The method of claim 2, wherein said semiconductor channel region is formed of a material selected from the group consisting of silicon, silicon-germanium, and silicon-germanium-carbon.

6. The method of claim 5, wherein said step of removing said first semiconductor layer does not appreciably remove said semiconductor channel region.

7. The method of claim 6, wherein an etch stop is epitaxially grown between said first semiconductor layer and said semiconductor channel region.

8. The method of claim 2, wherein said gate electrode is formed of a material selected from the group consisting of polysilicon, silicon-germanium, refractory metals, Ir, Al, Ru, Pt, and titanium nitride.

* * * * *